METHOD OF FABRICATING A SEMICONDUCTOR DEVICE

Filed April 2, 1963

2 Sheets-Sheet 1

INVENTOR.
JOHN A. SCHRAMM
BY
W. S. Hill
AGENT

INVENTOR.
JOHN A. SCHRAMM
BY
W.S. Hill
AGENT 3,281,915

METHOD OF FABRICATING A SEMICONDUCTOR DEVICE

John A. Schramm, Chalfont, Pa., assignor to Radio Corporation of America, a corporation of Delaware Filed Apr. 2, 1963, Ser. No. 269,979
4 Claims. (Cl. 29—25.3)

Figure 1:
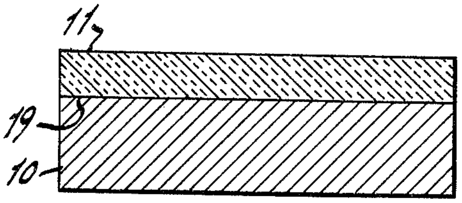

This invention relates to improved methods of fabricating improved semiconductor devices.

Semiconductor devices have been made which include a surface layer of silicon oxide on at least a portion of the surface thereof. See, for example, U.S. 2,796,562, issued to S. G. Ellis et al. on June 18, 1957, and assigned to the assignee of this application. The surface layer of silicon oxide may be formed by an oxidizing bath or by anodic oxidization, as described in U.S. 2,875,384, issued to J. T. Wallmark on February 24, 1959, and assigned to the assignee of this application. When the semiconductor device is formed from a silicon wafer, the silicon oxide layer on the surface of the device may be formed by heating the wafer in an oxidizing atmosphere which includes water vapor, as described in U.S. 2,802,760, issued to Derick et al. on October 13, 1957. It has also been proposed to make transistors and other semiconductor devices by a process which includes forming a silicon oxide masking layer on a silicon wafer, removing portions of this layer to expose the wafer surface, diffusing conductivity type modifiers into the exposed portions while leaving the oxide layer intact to protect the p-n junction which is formed, and making metallic contacts to the diffused areas while still leaving the oxide coating intact. Although satisfactory semiconductor devices having a silicon oxide coating upon at least a portion of the device surface have been made, improvement is desirable in several respects, particularly with respect to improved operating life and improved resistance to elevated voltages.

Accordingly, it is an object of this invention to provide an improved method of fabricating improved semiconductor devices.

Another object of the invention is to provide improved methods of fabricating semiconductor devices having a silicon oxide coating upon at least a portion of the surface thereof.

Still another object is to provide an improved method of fabricating semiconductor devices which results in an improved operating life for the devices.

A further object is to provide an improved method of fabricating silicon oxide coated semiconductor devices which affords the devices improved resistance to elevated voltages.

These and other objects are attained by an improved method of manufacturing semiconductor devices including an improved treatment of the surface of a semiconductor wafer which has been subjected to one or more conductivity modifier diffusion steps in the presence of a silicon oxide masking layer. After the completion of all the diffusion steps, the silicon oxide layer is first removed, and the wafer surface is then cleaned, for example by treatment with an acidified solution of hydrogen peroxide, to remove residual contaminants, such as metal ions, from parts of the wafer adjacent the regions into which impurities have been deliberately introduced to control the conductivity type thereof.

Figure 8:
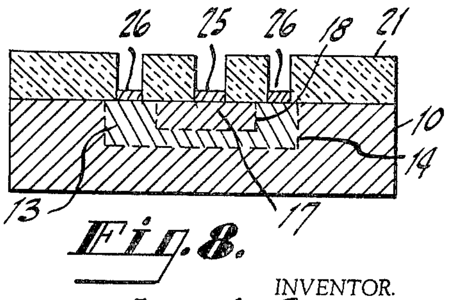
Figure 9:
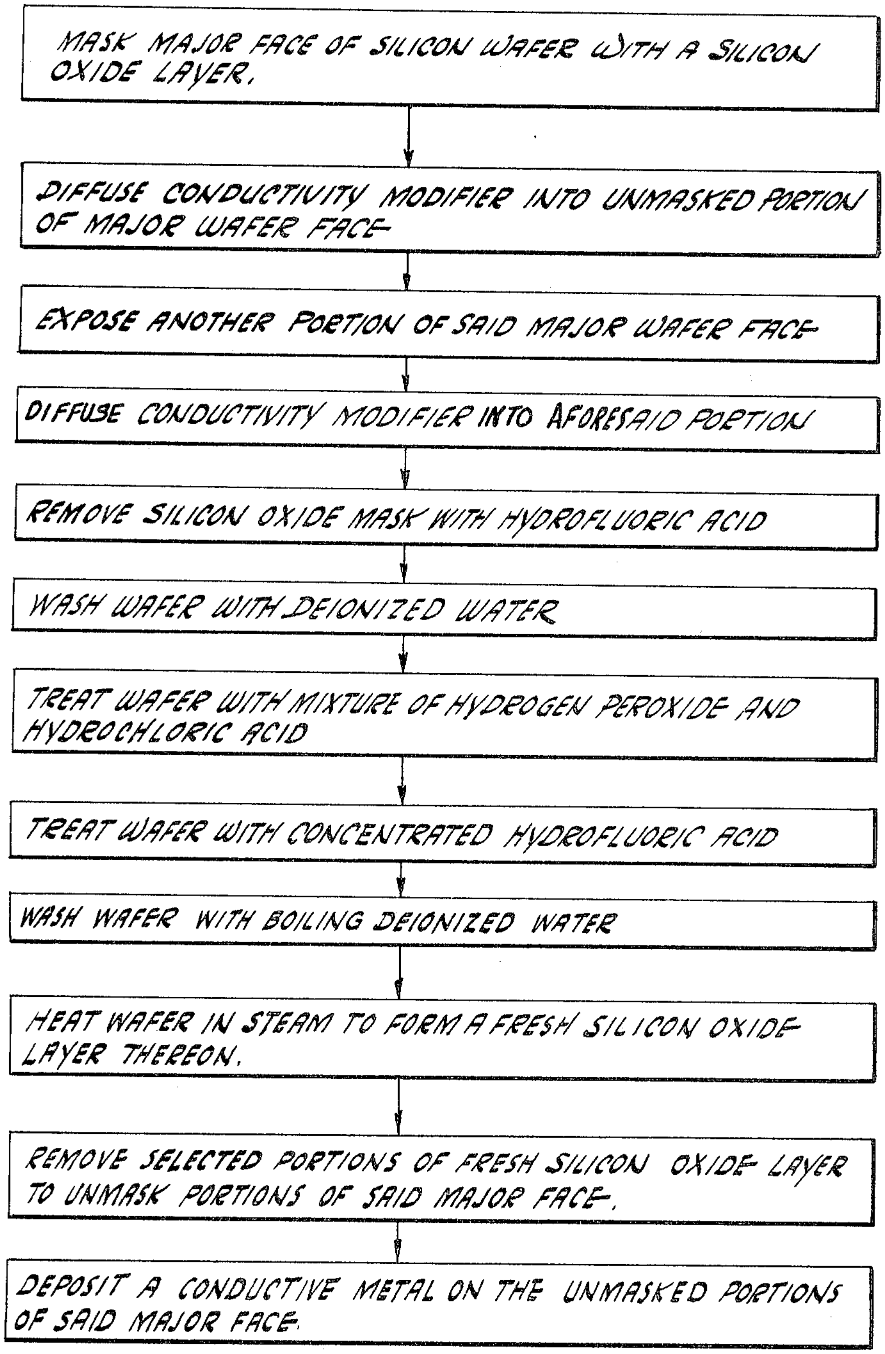

The invention will be described in greater detail by the following example, considered in conjunction with the accompanying drawing, in which:

FIGURES 1–8 are cross-sectional views of a semiconductive wafer during successive steps in the fabrication of a semiconductor device according to one embodiment of the invention; and, FIGURE 9 is a flow sheet of the method of fabricating semiconductor devices according to an embodiment of the invention.

*Example*

A semiconductor wafer 10 (FIGURE 1) of crystalline semiconductive material is prepared with at least one major face 19. The semiconductor material may consist of silicon, silicon-germanium alloys, germanium, or the like. In this example, wafer 10 consists of monocrystalline silicon. The exact size and shape of semiconductive wafer 10 is not critical. In this example, wafer 10 is about 50 mils square and 5 mils thick. The semiconductive wafer may be of either conductivity type, or intrinsic, or compensated. In this example, wafer 10 is of N-type conductivity. A layer 11 of silicon oxide is now deposited on major wafer face 19 by any convenient method. When wafer 10 consists of materials other than silicon, such as germanium, gallium arsenide, or the like, the silicon oxide layer 11 may be deposited by thermally decomposing a siloxane compound, and passing the vaporized decomposition products of the compound over the surface of the wafer. When wafer 10 consists of silicon, as in this example, the silicon oxide layer 11 may be formed by heating wafer 10 in steam for about 30 minutes at about 1100° C.

Figure 2:
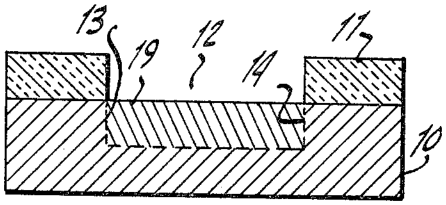

Referring now to FIGURE 2, a portion of the silicon oxide layer 11 is now removed by any convenient method, leaving in the layer 11 an aperture 12 in which is exposed a desired portion of wafer face 19. The desired portion of the silicon oxide layer 11 may be removed by either sand blasting or grinding. Alternatively, the silicon oxide layer 11 may be suitably masked with an acid resist (not shown) such as paraffin wax, or Apiezon wax, or with a photoresist such as a bichromated protein, and the unmasked portions of silicon oxide layer 11 removed by means of a suitable etchant, such as a concentrated aqueous solution of hydrofluoric acid. A conductivity type modifier is then diffused into the unmasked portion of wafer face 19. If an acid resist or photoresist has been used to define the aperture 12, the resist is removed prior to the diffusion step. In this example, diffusion is accomplished by heating wafer 10 in a nitrogen ambient containing boron oxide vapors for about 35 minutes at 925° C., then heating the wafer in steam for about two hours at 1200° C. The boron diffuses into the unmasked portion of wafer face 19. Since boron is an acceptor in silicon, the boron-diffused wafer region 13 is converted to P-type conductivity, and a p-n junction 14 is formed at the interface between the P-type boron-diffused region 13 and the N-type bulk of wafer 10.

Figure 3:
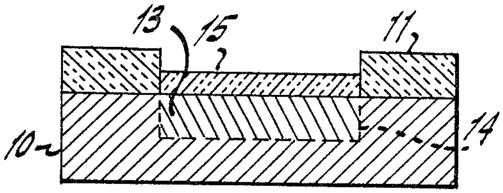

The unmasked portion of major face 19 is now covered with a mask 15 (FIGURE 3). The mask 15 may suitably consist of silicon oxide, and may be deposited by any convenient method, such as by thermally decomposing a siloxane compound to deposit silicon oxide on the water, as described above. Alternatively, when wafer 10 consists of silicon, as in this example, the silicon oxide layer 15 is formed during the diffusion step by the effect of steam on silicon.

Figure 4:
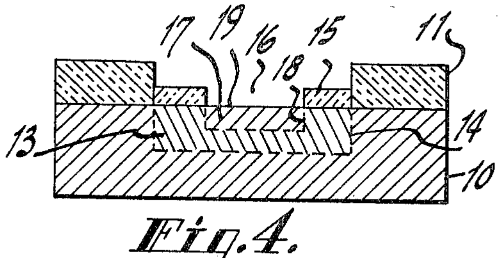

Referring now to FIGURE 4, a portion of silicon oxide mask 15 is removed by any convenient method, leaving in the mask 15 an aperture 16 in which is exposed a desired portion of wafer face 19. A second diffusion is now accomplished by heating wafer 10 in an ambient containing a conductivity type modifier capable of inducing the original conductivity type of the wafer (N-type in this example). Conveniently, this is accomplished by heating wafer 10 in the vapors of phosphorus pentoxide for about 8 minutes at about 1100° C. The phosphorus, which is a donor in silicon, diffuses into the unmasked portion of wafer face 19, and forms a phosphorus-diffused N-type region 17. The time, temperature and modifier concentration are selected so that region 17 is thinner than region 13, and is completely surrounded by region 13. A p-n junction 18 is formed at the interface between phosphorus-diffused N-type region 17 and the boron-diffused P-type region 13.

Figure 5:
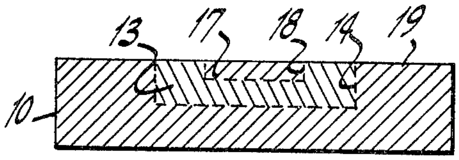

All of the silicon oxide coating on wafer face 19 is now removed, leaving wafer 10 with its surface exposed, as shown in FIGURE 5. The silicon oxide coating is conveniently removed by treating wafer 10 in a concentrated aqueous solution of hydrofluoric acid for a few minutes. The wafer is then washed in deionized or distilled water.

The surface of wafer 10 is now cleaned by treating the wafer in a bath having the composition 100 cc. concentrated hydrogen peroxide solution and .5 to 10 cc. of a concentrated strong acid, such as concentrated hydrochloric acid. In this example, the hydrogen peroxide solution contains about 30 weight percent $H_2O_2$, and the bath contains 1 cc. concentrated hydrochloric acid per 100 cc. of the peroxide solution. The wafer is immersed in the bath at room temperature, and the bath is then heated to about 85° to 95° C. This treatment tends to remove any metallic traces or other impurities from the wafer surface, but the hydrogen peroxide may cause the formation of a thin silicon oxide surface film when the wafer consists of silicon, as in this example. The wafer is therefore treated again with concentrated hydrofluoric acid to remove any silicon oxide film that has been formed, then washed with boiling deionized or distilled water.

Figure 6:
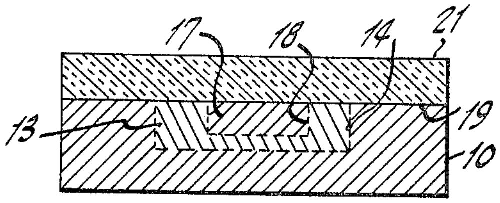
Figure 7:
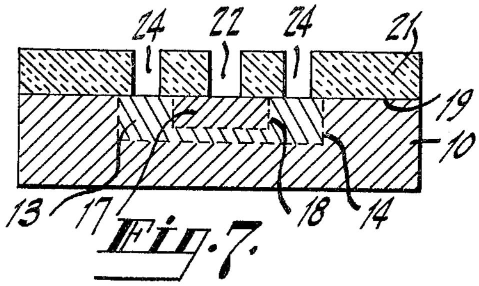

Referring now to FIGURE 6, a fresh layer or coating 21 of silicon oxide is now deposited on wafer face 19. The fresh silicon oxide coating 21 may be deposited by thermal oxidation of a siloxane compound, as described above. Since wafer 10 consists of silicon in this example, the fresh silicon oxide layer 21 is conveniently formed by heating water 10 in steam for about 15 minutes at 1100° C. During this heating step the phosphorus diffused region 17 becomes thicker.

Selected portions of silicon oxide coating 21 are now removed by any convenient method, such as grinding, sand blasting, or etching. A ring-shaped portion 24 (FIGURE 7) of wafer face 19 within the P-type region 13 is thereby exposed, as well as a portion 22 of wafer face 19 within the N-type region 13.

Referring now to FIGURE 8, a metal such as aluminum is evaporated on the exposed portions of wafer face 19, thereby forming a metallic contact 25 to the N-type emitter region 17, and a contact 26 to the P-type base region 13. The device is subsequently completed by attaching electrical lead wires to contacts 25 and 26, mounting wafer 10 on a base plate, and casing the device. These steps are accomplished by techniques known to the art, and do not form a part of this invention.

It has unexpectedly been found that when semiconductor devices having a silicon oxide surface layer are fabricated as described above, with a silicon oxide layer utilized as a diffusion mask, then removed from the wafer and the wafer surface treated to remove contaminants, the operating life of the device is improved. Moreover, the device thus fabricated shows improved resistance to elevated reverse voltages. While the exact mechanism responsible for the improvement is not understood, it is theorized that in devices made according to the prior art some traces of metallic and other impurities are present on the surface of the wafer and in the silicon oxide layer upon the wafer surface, and that these impurities migrate during the operation of the device, thereby adversely affecting the electrical parameters of the device. In the embodiment described above, the silicon oxide layer is removed, after all diffusion steps are complete, the exposed surface of the wafer is treated to remove metallic and other impurities, and a fresh clean layer of silicon oxide may then be deposited on the wafer. Accordingly, the amount of impurities present on the wafer surface and in the fresh silicon oxide layer is reduced, thereby improving the electrical parameters of the device, such as the breakdown voltage.

It will be understood that the above example is by way of illustration only, and not limitation, since various modifications and variations may be made without departing from the spirit and scope of the invention. For example, only a single diffusion step may be utilized, and the devices may be made of semiconductive materials other than silicon. The hydrogen peroxide acid bath utilized may contain lesser amounts of hydrogen peroxide, and the wafer treated in the bath for longer periods of time. Other strong acids, such as hydrobromic acid and nitric acid, may be utilized instead of the hydrochloric acid.

There has thus been described improved methods of making improved semiconductor devices.

What is claimed is:

1. The method of fabricating semiconductor device, comprising the steps of:
   - masking a portion of one major face of a given conductivity type semiconductive wafer with silicon oxide;
   - diffusing an opposite conductivity type modifier into the unmasked portion of said one wafer face to form a region of said opposite conductivity type adjacent said one face;
   - masking a portion of said one wafer face within said opposite conductivity type region;
   - diffusing a given conductivity type modifier into the unmasked portion of said one wafer face to form a region of said given conductivity type within said opposite conductivity type region;
   - removing said silicon oxide mask;
   - cleaning said one wafer face with a solution capable of oxidizing and removing contaminants therefrom;
   - forming a fresh silicon oxide layer upon said one wafer face;
   - removing portions of said fresh silicon oxide layer; and,
   - depositing metallic contacts on the uncovered portions of said one wafer face.

2. The method of fabricating a semiconductor device, comprising the steps of:
   - masking a portion of one major face of a given conductivity type semiconductive wafer with silicon oxide;
   - diffusing an opposite conductivity type modifier into the unmasked portion of said one wafer face to form a region of opposite conductivity type adjacent said one face;
   - masking a portion of said one wafer face adjacent said opposite conductivity type region;
   - diffusing a given conductivity type modifier into the unmasked portion of said one wafer face to form a region of said given conductivity type within said opposite conductivity type region;
   - removing said silicon oxide mask;
   - cleaning said one wafer face with an etchant capable of oxidizing and removing contaminants therefrom; and,
   - forming a fresh silicon oxide layer upon said one wafer face.

3. The method of fabricating a semiconductor device, comprising the steps of:
   - masking a portion of one major face of a given conductivity type semiconductive wafer with silicon oxide;
   - diffusing an opposite conductivity type modifier into the unmasked portion of said one wafer face to form a region of said opposite conductivity type adjacent said one face;
   - masking a portion of said one wafer face within said opposite conductivity type region;

diffusing a given conductivity type modifier into the unmasked portion of said one wafer face to form a region of said given conductivity type within said opposite conductivity type region;

removing said silicon oxide mask;

cleaning said one wafer face with an acidified hydrogen peroxide solution to remove contaminants therefrom; and, forming a fresh silicon oxide layer upon said one wafer face.

4. The method of fabricating a semiconductor device, comprising the steps of:

masking a portion of one major face of a given conductivity type silicon wafer with silicon oxide;

diffusing an opposite conductivity type modifier into the unmasked portion of said one wafer face to form a region of opposite conductivity type adjacent said one face;

removing said silicon oxide mask;

washing said wafer with a mixture of hydrogen peroxide and hydrochloric acid to remove metallic contaminants from said one face;

washing said wafer with hydrofluoric acid;

washing said wafer with water;

and re-forming a silicon oxide layer thereupon.

References Cited by the Examiner

UNITED STATES PATENTS

| | | | |
|---|---|---|---|
| 2,953,486 | 9/1960 | Atalla | 148—191 |
| 3,055,776 | 9/1962 | Stevenson | 117—212 |
| 3,085,033 | 4/1963 | Handelman | 148—191 |
| 3,147,152 | 9/1964 | Mendel | 148—186 X |

FOREIGN PATENTS

| | | |
|---|---|---|
| 920,306 | 3/1963 | Great Britain. |

OTHER REFERENCES

Aschner et al.: Journal of the Electrochemical Soc., May 1959, pp. 415–417.

HYLAND BIZOT, *Primary Examiner.*

BENJAMIN HENKIN, H. W. CUMMINGS, *Assistant Examiners.*